United States Patent
Narayanan et al.

(10) Patent No.: US 8,503,264 B1
(45) Date of Patent: Aug. 6, 2013

(54) REDUCING POWER CONSUMPTION IN A SEGMENTED MEMORY

(75) Inventors: Sridhar Narayanan, Cupertino, CA (US); Sridhar Subramanian, Cupertino, CA (US); Matthew H. Klein, Redwood City, CA (US); Patrick J. Crotty, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/300,512

(22) Filed: Nov. 18, 2011

(51) Int. Cl.
*G11C 5/14* (2006.01)

(52) U.S. Cl.
USPC .......................... 365/227; 365/226; 365/229

(58) Field of Classification Search
USPC .......................................... 365/227, 226, 229
See application file for complete search history.

(56) References Cited

U.S. PATENT DOCUMENTS

| | | | | |
|---|---|---|---|---|
| 4,354,259 A * | 10/1982 | Ishimoto | ................. | 365/230.02 |
| 5,438,548 A | 8/1995 | Houston | | |
| 5,481,690 A * | 1/1996 | Grumlose et al. | ............ | 711/167 |
| 5,835,435 A * | 11/1998 | Bogin et al. | ................. | 365/227 |
| 5,864,509 A | 1/1999 | Anumula | | |
| 6,356,500 B1 * | 3/2002 | Cloud et al. | ................. | 365/226 |
| 6,760,810 B2 | 7/2004 | Yamazaki et al. | | |
| 7,281,093 B1 | 10/2007 | Kulkarni et al. | | |
| 7,352,647 B1 * | 4/2008 | Saini | ........................ | 365/230.03 |
| 7,443,759 B1 * | 10/2008 | Rowlands et al. | ............ | 365/227 |
| 7,498,836 B1 * | 3/2009 | Tuan | ............................... | 326/38 |
| 7,502,977 B2 | 3/2009 | Venkatraman et al. | | |
| 7,529,955 B2 | 5/2009 | Kurts et al. | | |
| 7,620,926 B1 * | 11/2009 | Tuan | ............................. | 716/138 |
| 7,714,610 B2 * | 5/2010 | He | .................................. | 326/41 |
| 7,796,458 B2 * | 9/2010 | Rao | ................................ | 365/226 |
| 7,863,930 B2 * | 1/2011 | Nishioka | ......................... | 326/39 |
| 7,863,971 B1 * | 1/2011 | Nayak et al. | ................... | 327/546 |
| 7,865,747 B2 | 1/2011 | Buyuktosunoglu et al. | | |
| 8,098,540 B2 * | 1/2012 | Rao et al. | ................. | 365/230.05 |

OTHER PUBLICATIONS

Xilinx Inc., Abusaidi, P., et al., "Virtex-5 FPGA System Power Design Considerations," White Paper: Virtex-5 FPGAs, WP285 (v1.0), 23 pgs., Feb. 14, 2008.
Xilinx Inc., Rivoallon, F., "Reducing Switching Power with Intelligent Clock Gating," White Paper: Virtex-6 FPGA Family, WP370 (v1.2), 7 pgs., Oct. 5, 2010.
Xilinx Inc., Hussein, J., et al, "Lowering Power at 28 nm with Xilinx 7 Series FPGAs," White Paper: 7 Series FPGAs, WP389 (v1.0), 23 pgs., Feb. 24, 2011.
Zhang, K., et al., "SRAM Design on 65-nm CMOS Technology With Dynamic Sleep Transistor for Leakage Reduction," IEEE Journal of Solid-State Circuits, vol. 40, No. 4, pp. 895-901, Apr. 2005.
U.S. Appl. No. 12/835,638, filed Jul. 13, 2010, Manovit et al., Xilinx, Inc., San Jose, California, USA.

(Continued)

*Primary Examiner* — Viet Q Nguyen
(74) *Attorney, Agent, or Firm* — Kevin T. Cuenot

(57) ABSTRACT

A memory structure can include a first memory block including a plurality of memory cells corresponding to a first subset of addresses of a range of addresses and a second memory block including a plurality of memory cells corresponding to a second subset of addresses of the range of addresses. The memory structure can include control circuitry coupled to the first memory block and the second memory block and configured to provide control signals to the first memory block and the second memory block. The first memory block and the second memory block can be configured to implement a reduced power mode independently of one another responsive to the control signals.

8 Claims, 6 Drawing Sheets

OTHER PUBLICATIONS

U.S. Appl. No. 13/528,620, filed Jun. 20, 2012, Narayanan et al., Xilinx, Inc., San Jose, California, USA.

Abusaidi, Peggy et al., *Virtex-5 FPGA System Power Design Considerations*, WP285 (v1.0), Feb. 14, 2008, pp. 1-23, Xilinx, Inc., San Jose, California, USA.

Amrutur, B.S. et al. "Techniques to Reduce Power in Fast Wide Memories," *Technical Digest of the 1994 IEEE Symposium on Low Power Electronics*, Oct. 10, 1994, pp. 92-93, IEEE, Piscataway, New Jersey, USA.

Hussein, Jameel et al., *Lowering Power at 28 nm with Xilinx 7 Series FPGAs*, WP389 (v1.0), Feb. 24, 2011, pp. 1-23, Xilinx, Inc., San Jose, California, USA.

Le, Hoang et al., "Scalable High Throughput and Power Efficient IP-Lookup on FPGA," *Proc. of the IEEE 17th Symposium on Field Programmable Custon Computing Machines*, Apr. 5, 2009, pp. 167-174, IEEE, Piscataway, New Jersey, USA.

Liu, Ming et al., "Run-Time Partial Reconfiguration Speed Investigation and Architectural Design Space Exploration," *Proc. of the Int'l. Conf. on Field Programmable Logic and Applications*, Aug. 31, 2009, pp. 498-502, IEEE, Piscataway, New Jersey, USA.

Liu, Shaoshan et al., *Energy Reduction with Run-Time Partial Reconfiguration*, Microsoft Research Technical Report MSR-TR-2009-2017, Sep. 2009, pp. 1-12, Microsoft Research, Redmond, Washington, USA.

Paulsson, Katarina et al., "Cost-and Power Optimized FPGA based System Integration: Methodologies and Integration of a Low-Power Capacity-based Measurement Application on Xilinx FPGAs " *Proc. of the.Conference on Design, Automation and Test in Europe*, Mar. 10, 2008, pp. 50-55, IEEE, Piscataway, New Jersey, USA.

Rivoallon, Frederic, *Reducing Switching Power with Intelligent Clock Gating*, WP370 (v1.2), Oct. 5, 2010, pp. 1-7, Xilinx, Inc., San Jose, California, USA.

Tessier, Russell et al., "Power-aware RAM Mapping for FPGA Embedded Memory Blocks " *Proc. of the 2006 ACM/SIGDA 14th International Symposium on Field Programmable Gate Arrays*, Feb. 22, 2006, pp. 189-198, ACM, New York, New York, USA.

Tiwari, Anurag et al., "Saving Power by Mapping Finite-State Machines Into Embedded Memory Blocks in FPGAs," *Proc. of the Design, Automation and Test in Europe Conference and Exhibition*, Feb. 16, 2004, pp. 916-921, vol. 2, IEEE, Piscataway, New Jersey, USA.

Xilinx, Inc., *IP Processor Block RAM (BRAM) Block (v1.00a)*, D5444, Mar. 1, 2011, pp. 1-7, Xilinx, Inc., San Jose, California, USA.

Zhang, Kevin et al., "SRAM Design on 65-nm CMOS Technology With Dynamic Sleep Transistor for Leakage Reduction," *IEEE Journal of Solid-State Circuits*, Apr. 2005, pp. 895-901, vol. 40, No. 4, IEEE, Piscataway, New Jersey, USA.

\* cited by examiner

REDUCING POWER CONSUMPTION IN A SEGMENTED MEMORY

FIELD OF THE INVENTION

One or more embodiments disclosed within this specification relate to integrated circuits (ICs). More particularly, one or more embodiments relate to reducing power consumption in a segmented memory in an IC.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles can include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

When implementing a user circuit design, dedicated memory resources, such as the BRAMs noted above, are often utilized. Memory structures such as these, whether utilized within a programmable IC or an IC that is not programmable, can consume a sizable amount of power compared to other circuit resources. Within a memory-intensive user circuit design, for example, the memory structures can be responsible for consuming a significant amount of the total power used by the design implemented in the IC.

SUMMARY

One or more embodiments disclosed within this specification relate to integrated circuits (ICs) and, more particularly, to reducing power consumption in a segmented memory in an IC.

An embodiment can include a memory structure. The memory structure can include a first memory block including a plurality of memory cells corresponding to a first subset of addresses of a range of addresses and a second memory block including a plurality of memory cells corresponding to a second subset of addresses of the range of addresses. The memory structure can include control circuitry coupled to the first memory block and the second memory block and configured to provide control signals to the first memory block and the second memory block. The first memory block and the second memory block can be configured to implement a reduced power mode independently of one another responsive to the control signals.

Another embodiment can include a method of implementing a memory. The method can include mapping a contiguous range of addresses across a first memory block and a second memory block. Using a processor, determining an inactivity window specifying an amount of time during which the first memory block is not accessed from an analysis of a circuit design including the first and the second memory blocks. The method also can include adding or including, within the circuit design, circuitry implementing a reduced power mode for the first memory block during the inactivity window independently of the second memory block according to a comparison of the inactivity window with an inactivity threshold specifying an amount of time needed by the first memory block to enter and exit the reduced power mode.

Another embodiment can include an integrated circuit (IC). The IC can include a static random access memory including a plurality of memory blocks. An address range can be mapped across each of the plurality of memory blocks. The IC can include control circuitry coupled to each of the plurality of memory blocks, wherein the control circuitry is configured to generate control signals. Each memory block can be configured to implement a reduced power mode responsive to the control signals independently of each other memory block. The IC further can include a multiplexer coupled to an output of each of the plurality of memory blocks. The multiplexer can be configured, at least in part, to pass signals from the memory block not in the reduced power mode.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to reducing power consumption in segmented memories in an IC. In an IC, a memory can be formed or implemented using two or more different memory blocks, e.g., as a segmented memory. Control circuitry can be implemented to enable independent control over each of the memory blocks despite functioning as a single, larger memory. For example, circuitry to effectuate one or more reduced power modes within each of the constituent memory blocks forming the single, larger memory can be included so that each of the memory blocks can implement the reduced power mode independently of each other memory block. Thus, whereas conventional power reduction strategies typically are applied to an entire memory, e.g., the entire memory enters a reduced power mode or not, the one or more embodiments disclosed within this specification facilitate increased control by allowing different portions or segments of a memory to enter a reduced power mode while other portions or segments continue to operate.

Figure 1:
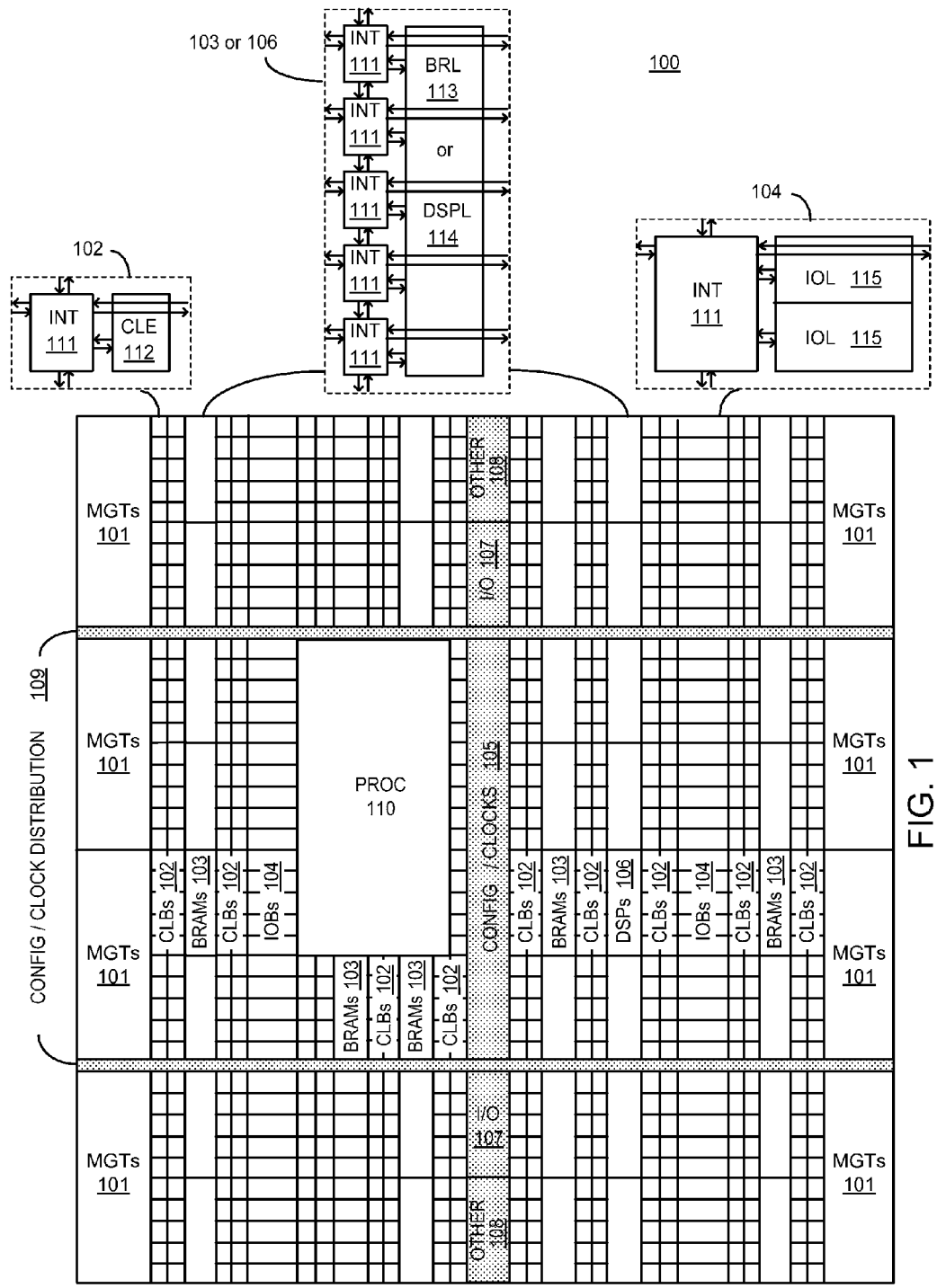
FIG. 1 is a first block diagram illustrating an architecture for an IC in accordance with an embodiment disclosed within this specification.

FIG. 1 is a first block diagram illustrating an architecture 100 for an IC in accordance with an embodiment disclosed within this specification. Architecture 100 can be implemented within a field programmable gate array (FPGA) type of IC, for example. As shown, architecture 100 includes several different types of programmable circuits, e.g., logic blocks. For example, architecture 100 can include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, the INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more INTs 111. Typically, the number of INTs 111 included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of INTs 111. An IOB 104 can include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die (shown shaded in FIG. 1) is used for configuration, clock, and other control logic. Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks can be programmable blocks and/or dedicated circuitry. For example, a processor block depicted as PROC 110 spans several columns of CLBs and BRAMs.

PROC 110 can be implemented as a hard-wired processor that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In a more complex arrangement, for example, PROC 110 can include one or more cores, e.g., central processing units, cache memories, a memory controller, unidirectional and/or bidirectional interfaces configurable to couple directly to I/O pins, e.g., I/O pads, of the IC and/or couple to the programmable circuitry of the IC. The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 can be considered part of the, or the, programmable circuitry of the IC.

FIG. 1 is intended to illustrate an exemplary architecture that can be used to implement an IC that includes programmable circuitry, e.g., a programmable fabric, and a processor system. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of PROC 110 within the IC is for purposes of illustration only and is not intended as a limitation of the one or more embodiments disclosed within this specification.

While an FPGA is used to illustrate the architecture described with reference to FIG. 1, it should be appreciated, that the one or more embodiments disclosed within this specification can be applied to other types of programmable ICs. Further, one or more aspects can be implemented within other types of ICs such as application specific ICs or the like.

Figure 2:
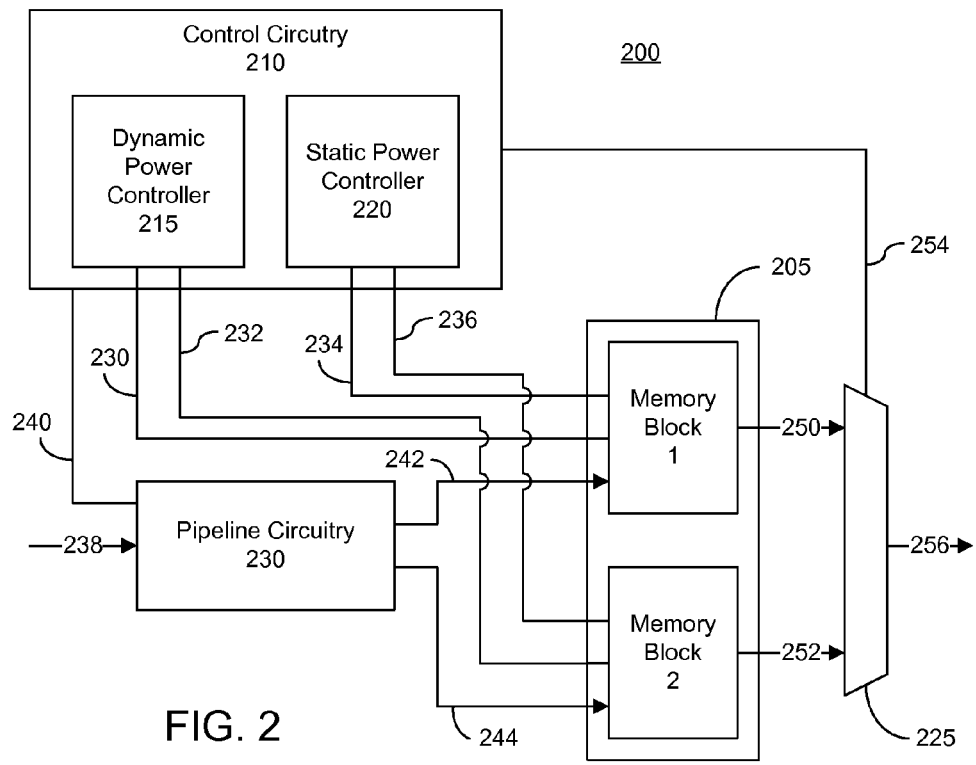
FIG. 2 is a second block diagram illustrating a system in accordance with another embodiment disclosed within this specification.

FIG. 2 is a second block diagram illustrating a system 200 in accordance with another embodiment disclosed within this specification. As shown, system 200 can include a memory 205. In one aspect, memory 205 can be implemented as a static random access memory (SRAM). Memory 205 can be formed of two or more smaller memories that can be coupled together to function as a single, larger memory. As pictured in FIG. 2, memory 205 includes a memory block 1 and a memory block 2, e.g., first and second memory blocks.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be. Like numbers will be used within this specification to the extent possible to facilitate a better understanding of the one or more embodiments described.

As used within this specification, the phrase "memory block" can refer to a physical memory that can be combined with other memory blocks, e.g., physical memories, to form a single, or unified, larger memory. For example, memory blocks 1 and 2 of FIG. 2 can be implemented as BRAMs previously illustrated with reference to FIG. 1. It should be appreciated that while two memory blocks form memory 205 in FIG. 2, more than two memory blocks can be used to form memory 205. As such, the particular number of memory blocks within memory 205 is not intended as a limitation of the one or more embodiments disclosed within this specification. One or more illustrative examples described within this specification, for instance, utilize four memory blocks to form a single, larger memory structure.

In one aspect, an address range can be mapped across each of the memory blocks forming memory 205. In this example, the address range can be mapped across memory block 1 and memory block 2. The address range can be a contiguous address range as would be used for a single, larger memory. A first subset of contiguous addresses of the address range can be assigned to memory block 1. A second subset of contiguous addresses of the address range can be assigned to memory block 2. Each address, for example, can correspond to a particular memory cell or a set of memory cells in one of the memory blocks of memory 205.

As shown, system 200 also can include control circuitry 210. Control circuitry 210 can be implemented to control when each of memory blocks 1 and 2 enters or initiates a reduced power mode. The reduced power mode can refer to a state in which dynamic power is reduced, in which static power is reduced, or a state in which both static and dynamic power are reduced within one or both of memory blocks 1 and 2. In this regard, control circuitry 210, depending upon the implementation of system 200, can implement or initiate the reduced power mode within memory block 1, but not in memory block 2; within memory block 2, but not in memory block 1; within both memory blocks 1 and 2 concurrently; or not within either one of the memory blocks 1 or 2.

Control circuitry 210 can include a dynamic power controller 215 and a static power controller 220. Dynamic power controller 215 can initiate or enable a reduced dynamic power mode within memory block 1, memory block 2, or both memory blocks 1 and 2. For purposes of description and illustration, a memory block in which reduced dynamic power mode has been enabled can be said to be "in the reduced dynamic power mode." Further, dynamic power controller 215 can discontinue or disable the reduced dynamic power mode within either one or both of the memory blocks within which the reduced dynamic power mode has been enabled. When in a reduced power mode, e.g., the reduced dynamic power mode, the memory block cannot be accessed. More particularly, when in a reduced power mode, data cannot be read from, or written to, the memory block.

In an embodiment, dynamic power controller 215 can provide one or more control signals to memory block 1 and to memory block 2. In one example, the control signals can be clock enable signals, at least with respect to dynamic power. As shown, dynamic power controller 215 can be configured to provide a clock enable (CE) signal 230 to memory block 1 and a CE signal 232 to memory block 2. CE signal 230 can be separate and independent of CE signal 232. Dynamic power controller 215 can be configured to provide CE signal 230 and CE signal 232 independently of each other.

Accordingly, memory block 1 can include a clock enable port that is coupled to CE signal 230. Responsive to CE signal 230 being asserted, clock gating circuitry within memory block 1 can begin gating the clock signal (not shown) provided to, and distributed throughout, memory block 1. Memory block 2 can include a clock enable port that is coupled to CE signal 232. Responsive to CE signal 232 being asserted, clock gating circuitry within memory block 2 can begin gating the clock signal (not shown) provided to, and distributed throughout, memory block 2. By gating the clock signal within one or both of memory blocks 1 and 2, the dynamic power consumed by the particular memory block for which the clock signal has been gated is reduced.

Static power controller 220 can be configured to initiate or enable a reduced static power mode within memory block 1, memory block 2, or both memory blocks 1 and 2. For purposes of description and illustration, a memory block in which reduced static power mode has been enabled can be said to be "in the reduced static power mode." Further, static power controller 220 can discontinue or disable the reduced static power mode within either one or both of the memory blocks in which the reduced static power mode has been enabled. When in a reduced power mode such as the reduced static power mode, data cannot be read from, or written to, the memory block.

In an embodiment, static power controller 220 can be configured to provide control signals to memory block 1 and memory block 2. As shown, static power controller 220 can provide signal 234 to memory block 1 and signal 236 to memory block 2. In one example, signals 234 and 236 can enable and disable a reduced static power mode within memory block 1 and memory block 2, respectively. In an embodiment, the reduced static power mode can be implemented as a retention mode. Accordingly, responsive to signals 234 and 236, memory blocks 1 and 2, respectively, can enter and exit the retention mode. In general, "retention mode" refers to a sleep type of mode in which memory block 1 and memory block 2 dissipate less static power than when in an operational mode during which data can be read or written. When in retention mode, however, data is still retained or preserved within the memory block.

In an embodiment, memory block 1 can output data via signal 250 to a multiplexer 225. Memory block 2 can output data via signal 252 to multiplexer 225. Multiplexer 225 can be configured to pass either signal 250 or 252 according to which of memory blocks 1 or 2 is outputting data. Multiplexer 225 can be controlled by control circuitry 210 through signal 254 to select which of signals 250 or 252 to pass as output signal 256. For example, multiplexer 225, under control of control circuitry 210, can be configured to pass only signals from memory blocks that are not in a reduced power mode.

In one aspect, multiplexer 225 can be implemented as soft circuitry using programmable circuitry of an IC, e.g., within an FPGA, in which system 200 is implemented. In that case, multiplexer 225 is typically located a significant distance from memory blocks 1 and 2, potentially resulting in increased routing congestion in the IC and increased power consumption by the IC. In another aspect, however, multiplexer 225 can be implemented in the form of hard-wired circuitry that can be implemented close, if not immediately adjacent, to memory blocks 1 and 2. In an arrangement in which multiplexer 225 is located close to memory blocks 1 and 2 and is implemented as hard-wired circuitry, increased routing congestion and power consumption can be avoided.

As used herein, "hard-wired circuitry" refers to circuitry that is to be distinguished from soft circuitry. Soft circuitry is implemented using the programmable circuitry of an IC and is only formed responsive to the loading of configuration data or bits after the manufacture of the IC. By comparison, hard-wired circuitry is manufactured as part of the IC. Hard-wired circuitry does not require the loading of configuration data to operate as intended or otherwise function. Furthermore, in general, hard-wired circuitry is thought of as having generally dedicated circuit blocks, interconnects, and inputs/outputs, even though a portion of the hard-wired circuitry can be set to operate or implement different operational modes responsive to register settings or other storage.

In other conventional configurations that involve more than one memory block, each memory block can be configured to output a portion of the data that is being read. Consider the case in which four memory blocks are included within a memory and the memory provides an 8-bit output. Each memory block can be configured to output two of the eight bits that can be read from the memory. A multiplexer is not required. By reading one or more bits of the total bits to be read out of the memory each clock cycle, however, the ability to implement power reduction techniques within any one of the memory blocks independently of the others is limited if not entirely precluded. By employing multiplexer 225 and reading the entire 8 bits from a single memory block at a time, e.g., each clock cycle (as opposed to obtaining 2 bits of the 8 bits from each memory block), reduced power modes can be employed in the memory blocks that are not being accessed.

In another embodiment, system 200 can include pipeline circuitry 230. Pipeline circuitry 230 optionally can be included depending upon the particular type of memory implemented by memory 205. Pipeline circuitry 230 can be illustrative of a pipeline, e.g., a signal path that includes one or more registers and/or memories arranged serially, through which data to be stored within memory 205 can flow. Pipeline circuitry 230 further can include a path through which addressing information specifying the location from which data is to be read or to which data is to be written with regard to memory 205 can flow. The data and addressing information can be collectively represented by signals 238, 242, and 244.

Inclusion of pipeline circuitry 230 allows control circuitry 210 to determine the particular address to which an access, e.g., a read operation or a write operation, is directed one or more clock cycles prior to the address arriving at memory 205. Thus, control circuitry 210 can be configured to read the address information via signal 240 from pipeline circuitry 230 prior to the address being provided to memory 205. It should be appreciated that the length of pipeline circuitry 230 can be determinative of how early control circuitry 210 receives addressing information. In any case, data and addressing information output from pipeline circuitry 230 can be provided to memory block 1 via signal 242 and to memory block 2 via signal 244.

In one illustrative example, memory block 1 and memory block 2 each can be implemented as BRAMs. More particularly, memory 205 can be implemented using a first RAMB36 type block as memory block 1 and a second RAMB36 type block that is adjacent to the first RAMB36 type block as memory block 2. RAMB36 type blocks are available within selected Xilinx® FPGAs. Memory block 1 and memory block 2 can be configured in a cascade arrangement in which the two memory blocks can function as a single, larger memory. For example, memory 205 can be implemented as a RAM that is 72 k deep by 1 bit in width using two adjacent RAMB36 type blocks in cascade mode.

As noted, the address range for accessing memory 205 can be mapped across each of memory blocks 1 and 2. Control circuitry 210 can be configured to determine the particular address that will be accessed in a given clock cycle, and in response, initiate clock gating within the memory block that is not accessed during the clock cycle via the clock enable port of that memory block. The address range can be subdivided into a first subset of addresses corresponding to memory block 1 and a second subset of address corresponding to memory block 2. Control circuitry 210 can determine the subset of addresses to which a memory access belongs and enable clock gating in the other memory block, or each other memory block when more than two, for example. Control circuitry 210 can continue to assert the clock enable signal for each memory block not accessed in the operation of memory 205 to reduce the dynamic power consumed by memory 205.

For example, when address_bit[15] of an address bus coupled to memory 205 is at a logic 1 value for one or more selected clock cycles, memory block 1 is being accessed during the selected clock cycles. Accordingly, control logic 210 and, more particularly, dynamic power controller 215, can set signal 232 to a logic 1 value during the selected clock cycles thereby disabling clocking within memory block 2 during the selected clock cycles. Dynamic power controller 215 can set signal 232 to a logic 0 value at the next clock cycle in which memory block 2 is accessed, e.g., the clock cycle immediately following the selected clock cycles. Disabling clocking reduces the dynamic power dissipation within memory block 2.

Similarly, when address_bit[15] is at a logic 0 value for one or more selected clock cycles, memory block 2 is being accessed during the selected clock cycles. Accordingly, control logic 210 and, more particularly, dynamic power controller 215, can set signal 230 to a logic 1 value during the selected clock cycles. Setting signal 230 to a logic 1, for example, can disable clocking within memory block 1 during the selected clock cycles. Dynamic power controller 215 can set signal 230 to a logic 0 value at the next clock cycle in which memory block 1 is accessed, e.g., the clock cycle immediately following the selected clock cycles. Accordingly, memory block 1 can implement the reduced power mode while memory block 2 is being accessed concurrently.

Using the techniques disclosed herein, dynamic power consumed by memory 205 can be reduced by as much as 50% when in the cascade mode configuration. As discussed, control circuitry 210 can obtain the addressing information via signal 240 from pipeline circuitry 230 one or more clock cycles prior to the address being available to memory 205 to facilitate the clock gating via the clock enable port of memory block 1 and memory block 2 as discussed above. It should be appreciated that in cases where more than two memory blocks are used, e.g., where four memory blocks are used to form memory 205, dynamic power can be reduced by more than 50%.

In another example, the address range of memory 205 again can be mapped across the memory blocks included therein. Memory 205 can be implemented as having a pre-configured addressing scheme such as, for example, a first-in-first-out (FIFO) or User-Mode Fault-On (UFO) type of addressing scheme. Preconfigured addressing schemes can also include any addressing scheme in which the memory is accessed using a base and an offset pointer.

For purposes of illustration, consider the case in which memory 205 is implemented as a FIFO having four memory blocks. Each of the memory blocks can include 64 memory locations. Since a FIFO is written in a linear address order, addresses can be mapped across each of the four memory blocks as follows: addresses 0-63 to memory block 1, addresses 64-127 to memory block 2, addresses 128-191 to memory block 3, and addresses 192-255 to memory block 4. Accordingly, at any given clock cycle, by decoding the most significant 2 bits in the write address, control circuitry 210 can disable clocking to the three memory blocks not being accessed during the current clock cycle to save dynamic power to memory 205.

Using a pre-configured addressing scheme also facilitates accurate prediction of when access transitions from one memory block to another memory block. This knowledge can be leveraged to reduce static leakage power by placing unused memory blocks in the reduced static power mode when not in use. With regard to reduced static power mode, a sufficient number of clock cycles must be provided to both put the memory block into the reduced static power mode and to bring the memory block out of the reduced static power mode prior to the next access of the memory block. Referring to the prior FIFO example, in addition to decoding the two most significant bits of the address for the current memory block being accessed, one or more additional bits can be decoded. Assuming an 8-bit address, when the remaining bits of the address are decoded (e.g., bits of the address other than the two most significant bits and the two least significant bits) and are at logic 1 values, at least four clock cycles are available to bring the next memory block to be accessed out of reduced static power mode. It should be appreciated that when this condition first occurs within a sequentially addressable FIFO, the two least significant bits will be logic 0 values.

While described with respect to writing data, a similar technique can be used to evaluate reading data from the memory blocks. Accordingly, in an embodiment, the determination of when a memory block is accessed can be made with respect to write ports, read ports, or both. Regarding reduced dynamic power mode, some memory blocks can include a clock enable port for the read port and another clock enable port for the write port. In that case, the implementation of reduced dynamic power mode can be made on a per port basis for each memory block independently. For example, for the write port, a determination of when the next write operation occurs on the write port can be made. The write port can be placed in reduced dynamic power mode until the next write operation. For the read port, a determination of when the next read operation occurs on the read port can be made. The read port can be placed in a reduced dynamic power mode until the next read operation occurs.

When a single clock enable port for reduced dynamic power is available for the entire memory block, the determination of when the memory block will be next accessed can be when the next read or write operation occurs. Similarly, for reduced static power mode, the determination of when a memory block is accessed can be when the next read or write operation occurs. In either case, the memory block can be placed in the reduced power mode until the next access.

Figure 3:
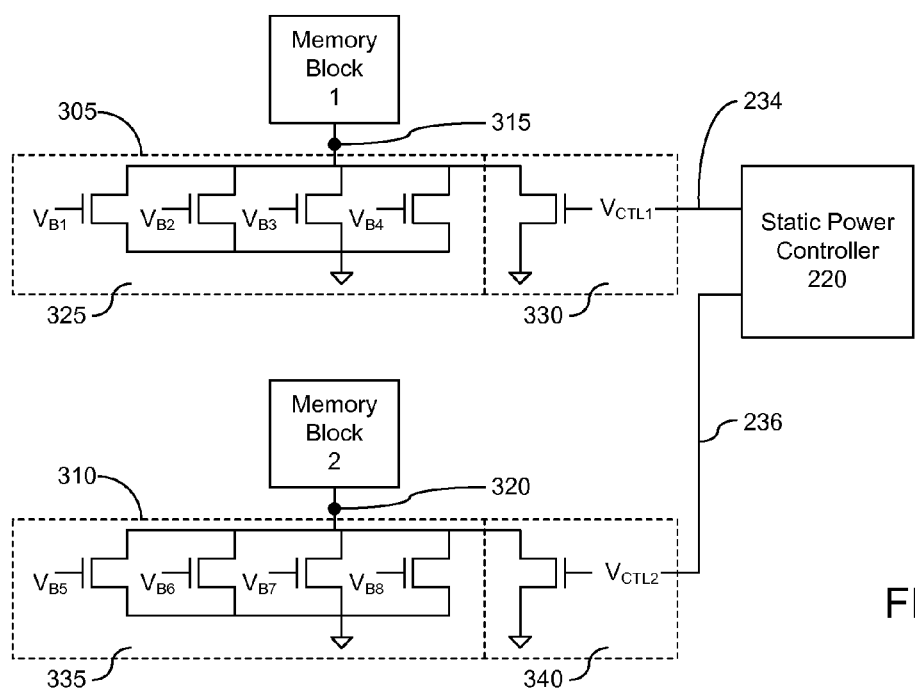
FIG. 3 is a third block diagram illustrating static power reduction circuitry in accordance with another embodiment disclosed within this specification.

FIG. 3 is a third block diagram illustrating static power reduction circuitry in accordance with another embodiment disclosed within this specification. FIG. 3 illustrates static power reduction circuitry that can be incorporated within system 200 of FIG. 2. While static power controller 220 was illustrated within FIG. 2 and briefly described, additional aspects of the static power reduction circuitry are illustrated within FIG. 3.

As shown, memory block 1 can be coupled to virtual ground circuitry 305. Memory block 2 can be coupled to virtual ground circuitry 310. Virtual ground circuitry 305 can be configured to implement a virtual ground at node 315. Virtual ground circuitry 310 can be configured to implement a virtual ground at node 320.

Virtual ground circuitry 305 can include biasing circuitry 325 and sleep circuitry 330. Biasing circuitry 325 can include one or more biasing transistor devices. A gate of each of the biasing transistor devices can be coupled to a signal that provides a bias voltage illustrated within FIG. 3 as $V_{B1}$, $V_{B2}$, $V_{B3}$, and $V_{B4}$. While four biasing transistors are shown as part of biasing circuitry 325, fewer or more biasing transistors can be used as may be required. As such, the particular number of biasing transistors used within biasing circuitry 325 is not intended as a limitation of the one or more embodiments disclosed within this specification.

Application of different bias voltages allows any of a plurality of different voltages to be achieved at node 315, thereby providing a virtual ground to memory block 1. The virtual ground can be a voltage potential that effectively reduces the rail-to-rail voltage, e.g., the difference between the voltage supply and ground, that is provided to memory block 1. As known, despite the reduction in rail-to-rail voltage, the difference in rail-to-rail voltage provided to memory block 1 must remain above a predetermined threshold voltage difference in order to retain data within memory block 1. Reduction in the rail-to-rail voltage allows the static power of memory block 1 to be reduced and places memory block 1 into what can be referred to as a reduced static power mode. In this example, reduced static power mode is a "retention mode" or a sleep mode.

Sleep circuitry 330 can include a sleep transistor having a gate that is coupled to signal 234. Signal 234, also labeled as $V_{CTL1}$, can control whether the sleep transistor is on or off. Retention mode for memory block 1 can be implemented by setting signal 234 to a logic 0 value, e.g., a zero voltage. When static power controller 220 sets signal 234 to a low voltage, the sleep transistor is off, thereby allowing biasing circuitry 325 to determine the voltage at node 315. When static power controller 220 sets signal 234 to a high voltage, the sleep transistor can be configured to turn on, thereby pulling node 315 to ground or substantially to ground. Appreciably, memory block 1 cannot be accessed, either read from or written to, when in a reduced static power mode such as retention mode. In some cases, depending upon the configuration of memory block 1 and retention mode circuitry 305, the number of clock cycles needed to enter the reduced static power mode and exit the reduced static power mode can vary. In this regard, it may require more than one clock cycle to enter and exit the reduced static power mode.

Virtual ground circuitry 310 can include biasing circuitry 335 and sleep circuitry 340. Biasing circuitry 335 can include one or more biasing transistor devices. Each gate of the biasing transistor devices can be coupled to a signal that provides a bias voltage illustrated within FIG. 3 as $V_{B5}$, $V_{B6}$, $V_{B7}$, and $V_{B8}$. Again, while four biasing transistors are shown as part of biasing circuitry 335, fewer or more biasing transistors can be used as may be required. As such, the particular number of biasing transistors used within biasing circuitry 335 is not intended as a limitation of the one or more embodiments disclosed within this specification.

Application of different bias voltages allows any of a plurality of different voltages to be achieved at node 320, thereby providing a virtual ground to memory block 2. The virtual ground can be a voltage potential that effectively reduces the rail-to-rail voltage, e.g., the difference between the voltage supply and ground, that is provided to memory block 2. Reduction in the rail-to-rail voltage allows the static power of memory block 2 to be reduced and places memory block 2 into a reduced static power mode, e.g., a "retention mode." The rail-to-rail voltage can remain above a predetermined threshold voltage difference in order to retain data within memory block 2 while in retention mode.

Sleep circuitry 340 can include a sleep transistor having a gate that is coupled to signal 236. Signal 236, also labeled $V_{CTL2}$, can control whether the sleep transistor in sleep circuitry 340 is on or off. Retention mode for memory block 2 can be implemented by setting signal 236 to a logic 0 value, e.g., a zero voltage. When static power controller 220 sets signal 236 to a low voltage, the sleep transistor is off, thereby allowing biasing circuitry 335 to determine the voltage at node 320. When static power controller 220 sets signal 236 to a high voltage, the sleep transistor can be configured to turn on thereby pulling node 320 to ground or substantially to ground. Appreciably, memory block 2 cannot be accessed, either read from or written to, when in a reduced static power mode such as retention mode. In some cases, depending upon the configuration of memory block 2 and retention mode circuitry 310, the number of clock cycles needed to enter the reduced static power mode and exit the reduced static power mode can vary. In this regard, it may require more than one clock cycle to enter and exit the reduced static power mode.

Static power controller 220 can be configured to implement the reduced static power mode within memory block 1 independently of implementing the reduced static power mode within memory block 2. In this regard, the particular memory that is not being accessed for one or more selected clock cycles can be placed into the reduced static power mode to reduce static power dissipation of memory 205.

Implementation of the reduced static power mode further can be implemented independently of the reduced dynamic power mode. Control circuitry 210, for example, can place either one or both of memory blocks 1 and 2 into the reduced static power mode, the reduced dynamic power mode, or both as described within this specification.

Figure 4:
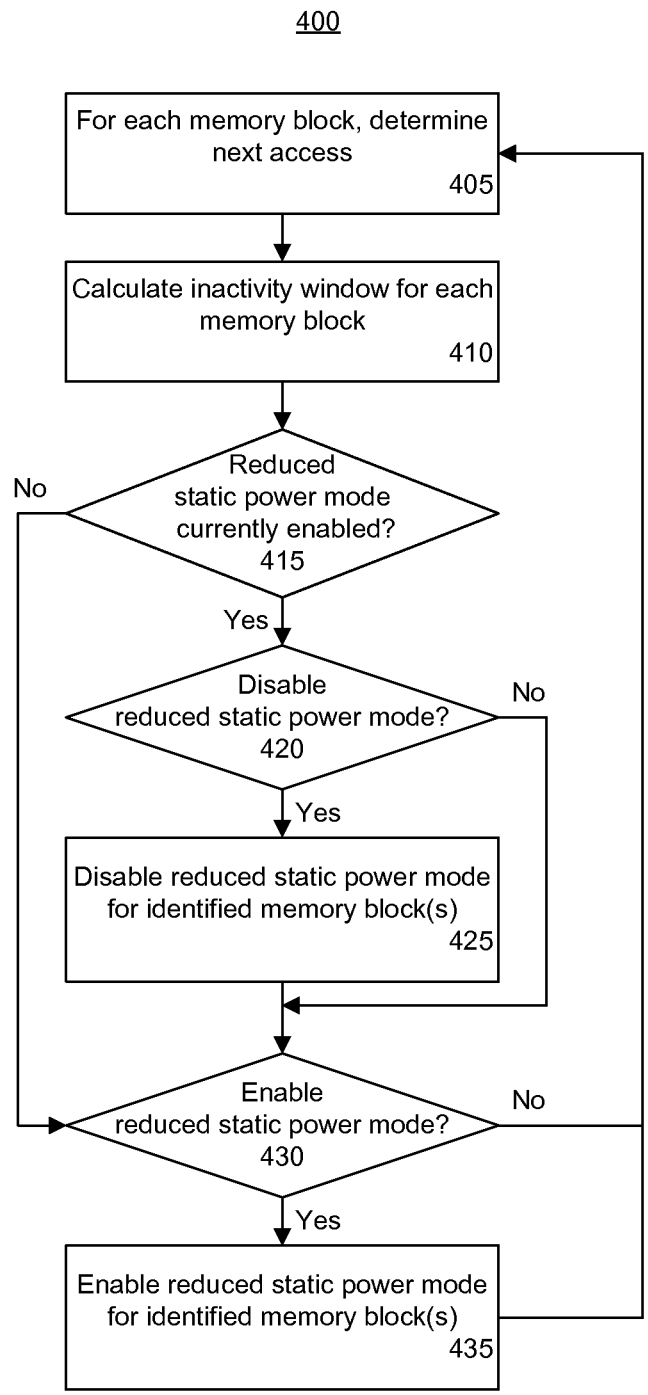
FIG. 4 is a first flow chart illustrating a method of operation of the system illustrated with reference to FIG. 2 in accordance with another embodiment disclosed within this specification.

FIG. 4 is a first flow chart illustrating a method 400 of operation of the system illustrated with reference to FIG. 2 in accordance with another embodiment disclosed within this specification. FIG. 4 illustrates an exemplary method of operation for control circuitry 210 and, e.g., for static power controller 220, when implemented within an IC. Method 400 illustrates an example in which the reduced static power mode is selectively enabled for each of the memory blocks used to implement the memory. As discussed, enablement of the reduced static power mode within a circuit in which static power reduction circuitry is implemented can be performed independently of enablement of the reduced dynamic power mode within the same circuit in which dynamic power reduction circuitry is implemented. Further, the two modes can be enabled concurrently for a same one of the memory blocks.

Method 400 can begin in step 405 in which the control circuitry can determine a next access for each memory block. For example, the control circuitry can, on a per memory block basis, determine the next clock cycle in which each memory block is going to be accessed. As discussed, an access of a memory block can include a read operation or a write operation directed to the memory block. The next access of a memory block can be determined according to the addressing scheme that is utilized by the memory and the address that is to be accessed. For example, addresses that are propagated through pipeline circuitry can be evaluated to determine addresses that are to be accessed one or more clock cycles in the future. In another example, when the memory has a preconfigured addressing scheme, the particular memory that is to be accessed with respect to read operations or write operations is known a priori and can be determined, e.g., when implemented as a FIFO memory.

In step 410, the control circuitry can calculate an inactivity window for each memory block. The inactivity window, for example, with reference to a particular memory block, can specify the number of clock cycles until that memory block is accessed. For example, the inactivity window can be specified as the number of clock cycles between the current clock cycle and the next clock cycle that the memory block is expected to be accessed.

In step 415, the control circuitry can determine whether the reduced static power mode is currently enabled within one or more of the memory blocks. When the reduced static power mode is currently enabled within at least one of the memory blocks, method 400 can continue to step 420. When the reduced static power mode is not currently enabled within at least one of the memory blocks, method 400 can continue to step 430.

In step 420, the control circuitry can determine whether to disable the reduced static power mode for any of the memory blocks determined to be in the reduced static power mode in step 415. The determination to disable the reduced static power mode can be made on a per memory block basis for each of the memory blocks determined to be in the reduced static power mode in step 415. It should be appreciated that one or more of the memory blocks identified within step 415 can also be in the reduced dynamic power mode.

For example, the control circuitry can store or incorporate a value that specifies an exit time for the reduced static power mode. The exit time for the reduced static power mode can specify the amount of time, e.g., a number of clock cycles, needed for a memory block to exit from or disable the reduced static power mode and begin normal operation to support read and/or write operations. The exit time for the reduced static power mode can depend upon the implementation of the reduced static power mode circuitry used. Referring to step 420, the control circuitry can compare the inactivity window of each memory block with the exit time for the reduced static power mode of the memory block. When the inactivity window of a memory block is greater than the exit time for the reduced static power mode for that memory block, the memory block can remain in the reduced static power mode. In that case, method 400 can proceed to step 430. Responsive to determining that the exit time for the reduced static power mode is equal to, or does not exceed, the inactivity window for one or more memory blocks, method 400 can proceed to step 425.

In step 425, the control circuitry can disable the reduced static power mode for any memory blocks identified in step 420. In particular, the control circuitry can signal the memory blocks identified in step 420 to exit or discontinue the reduced static power mode. The elevated virtual ground used for the memory blocks identified in step 420 can be allowed to return to normal ground. It should be appreciated that for those memory blocks in the reduced dynamic power mode, exiting the reduced static power mode does not affect implementation of the reduced dynamic power mode. After step 425, method 400 can continue to step 430.

In step 430, the control circuitry can determine whether to enable the reduced static power mode for any of the memory blocks. The determination to enable the reduced static power mode can be made on a per memory block basis, at least for the memory blocks that are not currently in the reduced static power mode. As discussed, the control circuitry can store or incorporate a value referred to as the exit time for the reduced static power mode. The control circuitry further can store a value referred to as the entry time for the reduced static power mode which refers to the amount of time to enable the reduced static power mode for a memory block.

It should be appreciated that the various times noted herein can be stored in any of a variety of formats. For example, the control circuitry can store a value referred to as the inactivity threshold for the reduced static power mode that can be a sum of the entry time and the exit time for the reduced static power mode. The inactivity threshold for the reduced static power mode can specify the total time needed for a memory block to enter and to exit from the reduced static power mode. When the entry time for the reduced static power mode and the exit time for the reduced static power mode are equivalent, only a single value need be stored since the entry time and the exit time for the reduced static power mode can be derived by dividing the inactivity threshold for static power reduction by two. Alternatively, the entry time or the exit time for the reduced static power mode can be stored thereby allowing the inactivity threshold for the reduced static power mode to be determined by multiplying the entry time or the exit time for the reduced static power mode by two. In another example, the entry time and the exit time for the reduced static power mode can be stored separately, thereby allowing the inactivity threshold for the reduced static power mode to be calculated when needed as a sum. In other examples, the inactivity threshold for the reduced static power mode can be stored with either the entry time or the exit time for the reduced static power mode, each of the three quantities can be stored, or the like.

Referring to step 430, for example, the control circuitry, can compare the inactivity window of memory blocks not already in the reduced static power mode with the total time needed to enter and exit from the reduced static power mode, i.e., the inactivity threshold for the reduced static power mode. The control circuitry can identify those circuit blocks having an inactivity window that is equal to, or that exceeds, the total time needed to enter and exit the reduced static power mode. When one or more of the memory blocks is identified in step 430 as being a candidate for the reduced static power mode, e.g., having an inactivity window meeting or exceeding the inactivity threshold for the reduced static power mode, method 400 can proceed to step 435. When none of the memory blocks has an inactivity window that meets or exceeds the inactivity threshold for the reduced static power mode, method 400 can loop back to step 405 to continue processing.

In step 435, the control circuitry can enable the reduced static power mode within the memory blocks identified in step 430. The control circuitry can signal the memory blocks identified in step 430 to enter the reduced static power mode. As discussed, for example, the virtual ground for the memory blocks identified in step 430 can be increased to reduce the rail-to-rail voltage. As discussed, the implementation of the reduced static power mode within a memory block can be made irrespective of whether that memory block is in the reduced dynamic power mode. After step 435, method 400 can loop back to step 405 to continue processing.

Method 400 is provided for purposes of illustration and example only. In one or more embodiments, the techniques utilized by the control circuitry can be implemented by a state machine that can be configured during the circuit design process since knowledge of the addressing scheme utilized by the memory and any memory blocks contained therein will be known. Accordingly, the various time periods described with reference to FIG. 4, for example, can be known and are referenced for purposes of illustration only.

Figure 5:
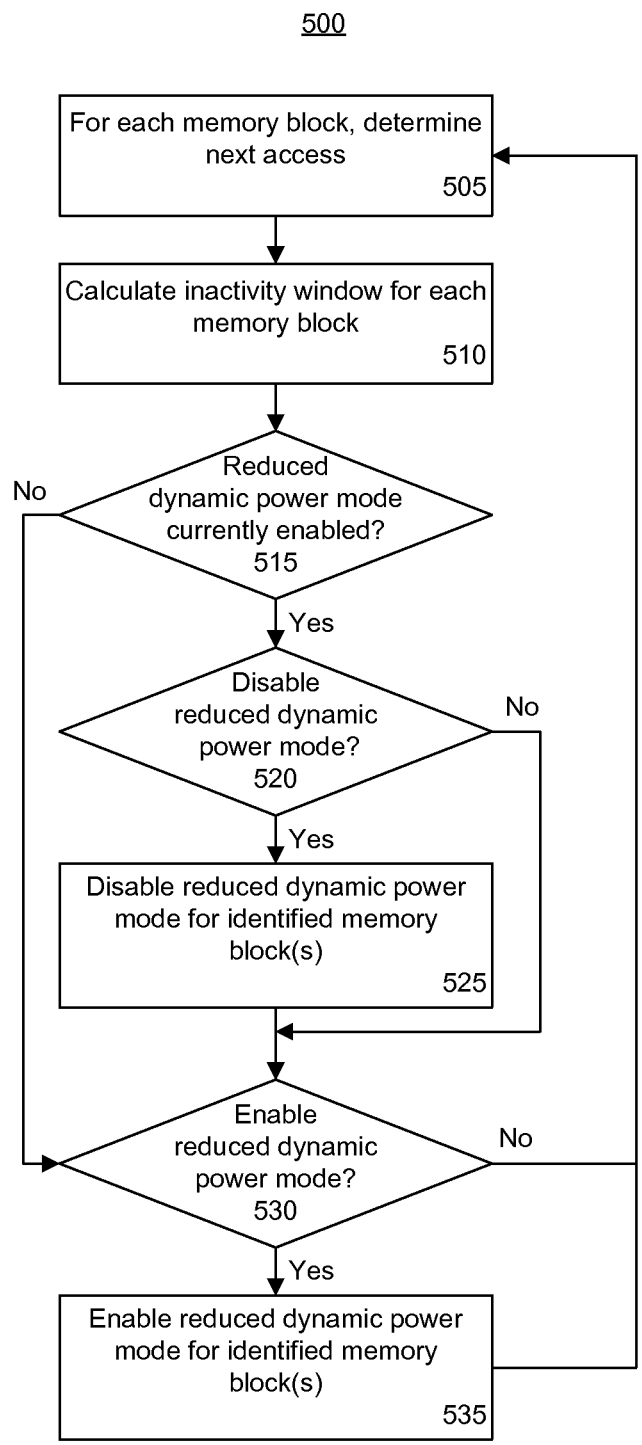
FIG. 5 is a second flow chart illustrating a method of operation of the system illustrated with reference to FIG. 2 in accordance with another embodiment disclosed within this specification.

FIG. 5 is a second flow chart illustrating a method 500 of operation of the system illustrated with reference to FIG. 2 in accordance with another embodiment disclosed within this specification. FIG. 5 illustrates an exemplary method of operation of control circuitry 210 and, e.g., for dynamic power controller 215, when implemented within an IC. Method 500 illustrates an example in which the reduced dynamic power mode is selectively enabled for each of the memory blocks used to implement the memory. As discussed, enablement of the reduced dynamic power mode within a circuit in which dynamic power reduction circuitry is implemented can be performed independently of enablement of the reduced static power mode within the same circuit in which the dynamic power reduction circuitry is implemented.

Method 500 can begin in step 505 in which the control circuitry can determine a next access for each memory block. In step 510, the control circuitry can calculate an inactivity window for each memory block. Steps 505 and 510 can be performed largely as described with reference to steps 405 and 410 of FIG. 4. In one aspect, the control circuitry can include an evaluation circuit block that can be accessed by each of the static power controller and the dynamic power controller to perform the analysis of the next access time and/or the inactivity window for each memory block rather than duplicating the functionality across each respective controller.

In step 515, the control circuitry can determine whether a reduced dynamic power mode is currently enabled within one or more of the memory blocks. When the reduced dynamic power mode is currently enabled within at least one of the memory blocks, method 500 can continue to step 520. When the reduced dynamic power mode is not currently enabled within at least one of the memory blocks, method 500 can continue to step 530.

In step 520, the control circuitry can determine whether to disable the reduced dynamic power mode for any of the memory blocks identified in step 515. The determination to disable the reduced dynamic power mode can be made on a per memory block basis for each of the memory blocks determined to be in the reduced dynamic power mode.

For example, the control circuitry can include a value that specifies an exit time for the reduced dynamic power mode. The exit time for the reduced dynamic power mode can specify an amount of time needed for a memory block to discontinue or exit the reduced dynamic power mode and begin normal operation to support read and/or write operations. The exit time for the reduced dynamic power mode can be one or more clock cycles and will depend upon the implementation of the reduced dynamic power mode circuitry used. Referring to step 520, the control circuitry can compare the inactivity window of each memory block identified in step 515 with the exit time for the reduced dynamic power mode of the memory block. When the inactivity window of a memory block is greater than the exit time for the reduced dynamic power mode for that memory block, the control circuitry can allow the memory block to remain in the reduced dynamic power mode. In that case, method 500 can proceed to step 530. Responsive to determining that the exit time for the reduced dynamic power mode is equal to, or does not exceed, the inactivity window for one or more memory blocks, method 500 can proceed to step 525.

In step 525, the control circuitry can disable the reduced dynamic power mode for any memory blocks identified in step 520. In particular, the control circuitry can signal the memory blocks identified in step 520 to exit or discontinue the reduced dynamic power mode. For example, the control circuitry can discontinue clock gating within the memory blocks identified within step 520. After step 525, method 500 can continue to step 530.

In step 530, the control circuitry can determine whether to enable the reduced dynamic power mode for one or more memory blocks. The determination to enable the reduced dynamic power mode can be made on a per memory block basis, at least for the memory blocks that are not currently in the reduced dynamic power mode. Reduced dynamic power mode, however, can be enabled for memory blocks irrespective of whether the memory blocks are in the reduced static power mode.

For example, the control circuitry can incorporate or store a value referred to as the entry time for the reduced dynamic power mode which specifies the amount of time needed for a memory block to enter or enable the reduced dynamic power mode. As noted, the various times noted herein can be stored in any of a variety of formats. For example, the control circuitry can store a value referred to as the inactivity threshold for the dynamic power mode that can be a sum of the entry time for the reduced dynamic power mode and the exit time for the reduced dynamic power mode. When the entry time for the reduced dynamic power mode and the exit time for the reduced dynamic power mode are equivalent, only a single value need be stored since the entry time and the exit time for the reduced dynamic power mode can be derived by dividing the inactivity threshold for the reduced dynamic power mode by two. Alternatively, the entry time for the reduced dynamic power mode or the exit time for the reduced dynamic power mode can be stored thereby allowing the inactivity threshold for the reduced dynamic power mode to be determined by multiplying the entry time or the exit time for the reduced dynamic power mode by two. In another example, the entry time for the reduced dynamic power mode and the exit time for the reduced dynamic power mode can be stored separately thereby allowing the inactivity threshold for the reduced dynamic power mode to be calculated when needed as a sum. In other examples, the inactivity threshold for the reduced dynamic power mode can be stored with either the entry time for the reduced dynamic power mode or the exit time for the reduced dynamic power mode, each of the three quantities can be stored, or the like.

Referring to step 530, for example, the control circuitry, can compare the inactivity window with the inactivity threshold for the reduced dynamic power mode. The control circuitry can identify those circuit blocks not in the reduced dynamic power mode that have an inactivity window that is equal to, or that exceeds, the inactivity threshold for the reduced dynamic power mode. When one or more of the memory blocks is identified in step 530 as being a candidate for enabling the reduced dynamic power mode, e.g., having an inactivity window meeting or exceeding the total time to enter and exit the reduced dynamic power mode, method 500 can proceed to step 535. When none of the memory blocks has an inactivity window that meets or exceeds the inactivity threshold for the reduced dynamic power mode, method 500 can loop back to step 505 to continue processing.

In step 535, the control circuitry can enable the reduced dynamic power mode within the memory blocks identified in step 530. The control circuitry can signal the memory blocks identified in step 530 to enter the reduced dynamic power mode. For example, the control circuitry can initiate clock gating within the memory blocks identified in step 530. The enablement of the reduced dynamic power mode can be performed irrespective of whether the memory blocks are in reduced static power mode. After step 530, method 500 can loop back to step 505 to continue processing.

Method 500 is provided for purposes of illustration and example only. In one or more embodiments, the techniques utilized by the control circuitry can be implemented by a state machine that can be configured during the circuit design process since knowledge of the addressing scheme utilized by the memory and any memory blocks contained therein will be known. Accordingly, the various time periods described with reference to FIG. 5, for example, can be known and are referenced for purposes of illustration only.

As discussed, the techniques illustrated in FIGS. 4 and 5 can be performed concurrently by the control circuitry thereby allowing independent enablement of reduced static power mode and reduced dynamic power mode for each memory block of a memory within a circuit in which both dynamic power reduction circuitry and static power reduction circuitry have been implemented. Further, when only one type of power reduction circuitry is implemented, then the control circuitry can be configured to perform either the method illustrated in FIG. 4 or the method illustrated in FIG. 5 as the case may be.

In general, the inactivity window for reduced dynamic power mode can be considered a subset of the inactivity window for the reduced static power mode. In that case, while each mode can be implemented independently of the other, a memory block exiting the reduced dynamic power mode will have previously exited from the reduced static power mode.

Figure 6:
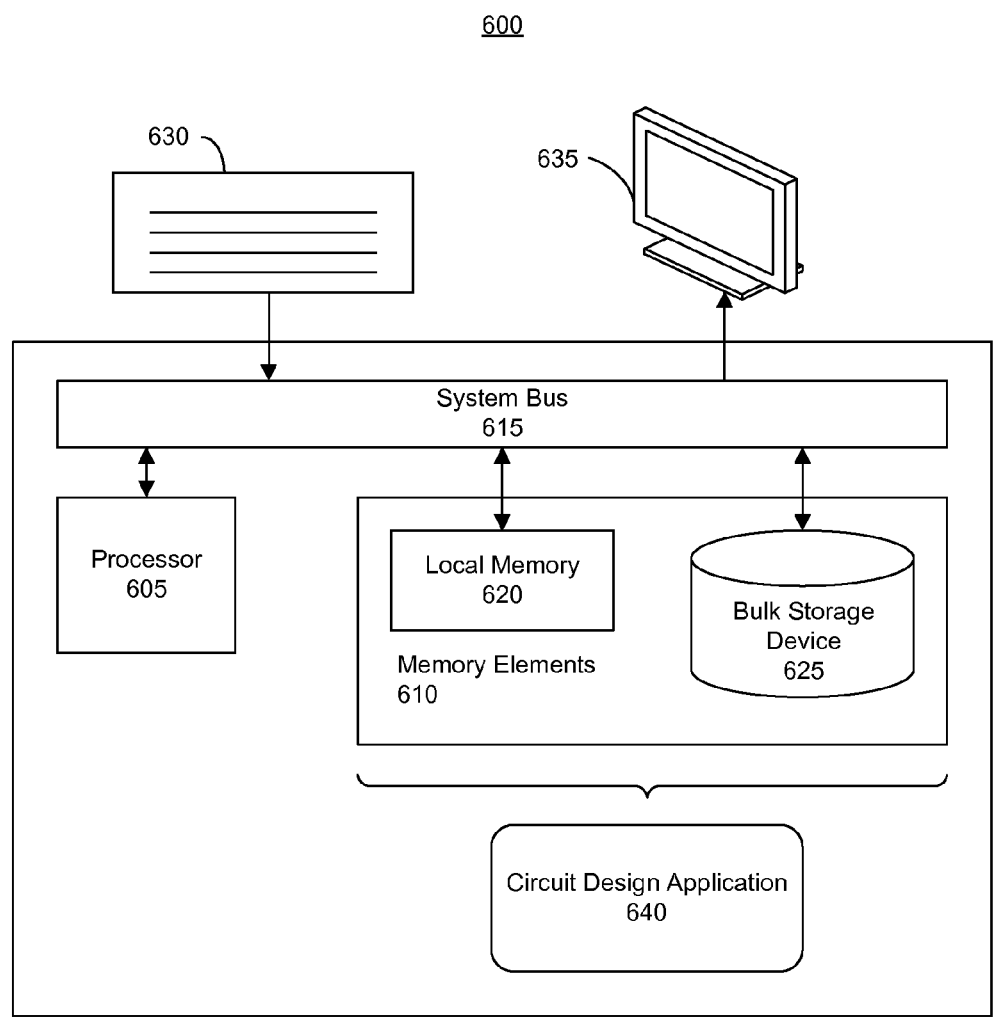
FIG. 6 is a fourth block diagram illustrating a system for generating a circuit design in accordance with another embodiment disclosed within this specification.

FIG. 6 is a fourth block diagram illustrating a system 600 for generating a circuit design in accordance with another embodiment disclosed within this specification. In one aspect, system 600 can generate and/or analyze one or more circuit designs for implementation within an IC. The circuit designs that are generated can be implemented within an IC, whether the IC is a programmable IC or not.

System 600 can include at least one processor 605 coupled to memory elements 610 through a system bus 615. As such, system 600 can store program code within memory elements 610. Processor 605 can execute the program code accessed from memory elements 610 via system bus 615. In one aspect, for example, system 600 can be implemented as a computer that is suitable for storing and/or executing program code. It should be appreciated, however, that system 600 can be implemented in the form of any system including a processor and memory that is capable of performing the functions described within this specification.

Memory elements 610 can include one or more physical memory devices such as, for example, local memory 620 and one or more bulk storage devices 625. Local memory 620 refers to random access memory or other non-persistent memory device(s) generally used during actual execution of the program code. Bulk storage device(s) 625 can be implemented as a hard drive or other persistent data storage device. System 600 also can include one or more cache memories (not shown) that provide temporary storage of at least some program code in order to reduce the number of times program code must be retrieved from bulk storage device 625 during execution.

Input/output (I/O) devices such as a keyboard 630, a display 635, and a pointing device (not shown) optionally can be coupled to system 600. The I/O devices can be coupled to system 600 either directly or through intervening I/O controllers. Network adapters also can be coupled to system 600 to enable system 600 to become coupled to other systems, computer systems, remote printers, and/or remote storage devices through intervening private or public networks. Modems, cable modems, and Ethernet cards are examples of different types of network adapters that can be used with system 600.

As pictured in FIG. 6, memory elements 610 can store a circuit design application (application) 640. Application 640, being implemented in the form of executable program code, can be executed by system 600. Application 640 can include instructions for generating a circuit design and/or for analyzing a circuit design for implementation within an IC. For example, system 600, executing application 640, can be configured to perform one or more executable operations implementing the various process steps described within this specification for implementing a segmented memory system as described.

As known, a circuit design can be specified in programmatic form, whether as a netlist, as one or more hardware description language files, or the like. System 600 can be configured to analyze a circuit design and to implement the various power saving techniques described herein with respect to a given circuit design loaded therein.

Figure 7:
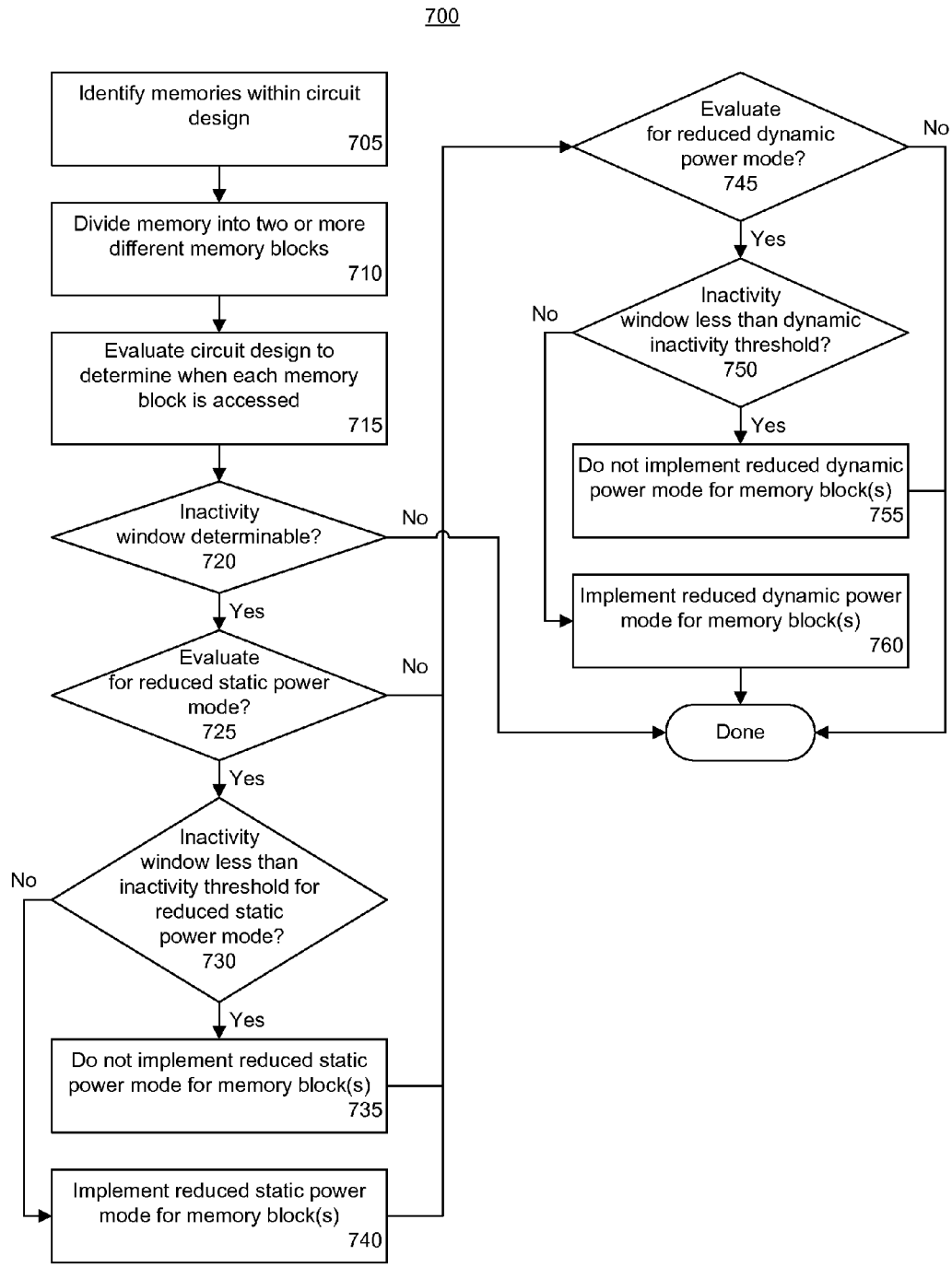
FIG. 7 is a third flow chart illustrating a method of circuit design in accordance with another embodiment disclosed within this specification.

FIG. 7 is a third flow chart illustrating a method 700 of circuit design in accordance with another embodiment disclosed within this specification. Method 700 can be implemented using a system as described with reference to FIG. 6 to implement and/or to analyze a circuit design to implement the various power reduction techniques described within this specification. Method 700 can begin in a state where a circuit design has been identified or loaded into the system.

Beginning in step 705, the system can identify a memory within the circuit design. For purposes of illustration, method 700 is described with respect to a single memory of the circuit design. It should be appreciated that method 700 can be performed one or more additional times for additional and different memories within the circuit design to implement power reduction techniques for each such memory if so desired.

In step 710, the memory can be analyzed to identify the number and organization of the memory blocks that constitute the memory identified in step 705. In step 715, the system can evaluate the circuit design to determine when each memory block is accessed. More particularly, the system can analyze the address access system, e.g., circuitry, specified within the circuit design for the memory to derive the conditions under which the various memory blocks forming the memory are accessed, e.g., read or written, and therefore, the conditions under which reduced static power mode and/or reduced dynamic power mode can be implemented and enabled within each respective memory block.

For example, the system can determine whether a memory is implemented as a FIFO type of memory, e.g., a memory having a predetermined addressing scheme or one that is sequential in nature. When the memory is implemented in a sequential fashion, the system can derive the control signals needed to place the memory blocks into reduced static and/or dynamic power modes. Similarly, the system can also determine whether the memory is implemented as a cascade mode configuration previously described where the range of addresses for the memory are segmented or spread across the various, constituent memory blocks and use that information to determine the subset of address bits used to access each memory block in the memory.

In another example, the system can determine whether a memory is to be used in specialized applications with unique address decoding mechanisms such as a packet buffer in a networking application. The address mechanism, for example, can store packets in specific memory blocks based upon a decoding of the packet header. The decoding logic for the packet headers can be analyzed and used to derive the control signals and timing of the control signals for implementing reduced static and/or dynamic power modes.

In still another example, the system can determine whether pipeline circuitry is utilized in combination with the access mechanism to the memory. Detection of pipeline circuitry can be used in cases where the memory blocks are accessed in a non-deterministic manner or in a random manner. The system can determine whether the address used for memory operations can be intercepted one or more cycles prior to being presented to the memory. The intercepted address can be used to derive the control signals needed to implement the reduced static and/or dynamic power modes.

Continuing with step 720, the system can determine whether an inactivity window for the memory blocks can be calculated, e.g., is determinable. When an inactivity window for one or more of the memory blocks can be determined based upon the analysis described, method 700 can proceed to step 725. When an inactivity window cannot be determined, the method can end.

In step 725, the system can determine whether to evaluate the circuit design for static power reduction. For example, a user preference setting can be checked to determine whether the system is to attempt to implement a reduced static power mode for the memory. When the system is to evaluate the circuit design for implementation of a reduced static power mode, method 700 can proceed to step 730. When the system is not to evaluate the circuit design for implementation of a reduced static power mode, method 700 can continue to step 745.

In step 730, the system can determine whether the inactivity window of each memory block of the memory is less than an inactivity threshold for the reduced static power mode for each respective memory block. The system, for example, can be programmed to include an inactivity threshold for the reduced static power mode that is determined based upon the particular memory that is being evaluated and the control circuitry that can be implemented within the circuit design automatically by the system.

When the inactivity window is less than the inactivity threshold for the reduced static power mode, method 700 can continue to step 735. In step 735, the system does not implement the reduced static power mode for the memory blocks. More particularly, the system does not insert, include, or add programmatic circuit description into the circuit design implementing or specifying the reduced static power mode circuitry. When the inactivity window is greater than or equal to the inactivity threshold for the reduced static power mode, method 700 can proceed to step 740. In step 740, the system can implement the reduced static power mode for the memory blocks identified in step 730. For example, the system can insert, include, or add programmatic circuit description into the circuit design to specify the control circuitry, e.g., a static power controller, and the corresponding signals to control the virtual ground circuitry as described within this specification for the identified memory blocks.

In step 745, the system can determine whether to evaluate the circuit design for implementation of a reduced dynamic power mode. For example, a user preference setting can be checked to determine whether the system is to attempt to implement a reduced dynamic power mode for the memory. When the system is to evaluate the circuit design for implementation of a reduced dynamic power mode, method 700 can proceed to step 750. When the system is not to evaluate the circuit design for implementation of a reduced dynamic power mode, method 700 can continue to step 760.

In step 750, the system can determine whether the inactivity window of each memory block of the memory is less than the inactivity threshold for the reduced dynamic power mode for each respective memory block. The system, for example, can be programmed to include an inactivity threshold for the reduced dynamic power mode that is determined based upon the particular memory that is being evaluated and the control circuitry that can be implemented within the circuit design automatically by the system.

When the inactivity window is less than the inactivity threshold for the reduced dynamic power mode, method 700 can continue to step 755. In step 755, the system does not implement the reduced dynamic power mode for the memory blocks. More particularly, the system does not insert, include, or add programmatic description into the circuit design implementing or specifying reduced dynamic power mode circuitry. When the inactivity window is greater than or equal to the inactivity threshold for the reduced dynamic power mode, method 700 can proceed to step 760. In step 760, the system can implement the reduced dynamic power mode for the memory blocks identified in step 750. For example, the system can insert programmatic circuit description into the circuit design specifying control circuitry, e.g., a dynamic power controller, that can provide clock enable signals to the clock enable ports of each of the identified memory blocks as described within this specification.

The one or more embodiments disclosed within this specification illustrate various techniques for implementing and enabling power reduction techniques for a memory that is segmented into two or more different physical blocks. Reduced static power and reduced dynamic power modes can be implemented within each respective block of the memory independently of the other blocks as opposed to applying such techniques to the entire memory. As such, increased control over power consumption can be provided that can reduce the power consumed by a circuit design by a significant amount.

The flowcharts in the figures illustrate the architecture, functionality, and operation of possible implementations of systems, methods and computer program products according to one or more embodiments disclosed within this specification. In this regard, each block in the flowcharts can represent a module, segment, or portion of code, which includes one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a non-transitory computer-usable or computer-readable medium, storing program code that, when loaded and executed in a system comprising memory and a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A memory structure comprising:
    a first memory block comprising a plurality of memory cells corresponding to a first subset of addresses of a range of addresses;
    a second memory block comprising a plurality of memory cells corresponding to a second subset of addresses of the range of addresses; and
    control circuitry coupled to the first memory block and the second memory block,
    wherein the control circuitry comprises a dynamic power controller and a static power controller each configured to provide control signals to the first memory block and the second memory block, and
    wherein the first memory block and the second memory block are configured to implement at least one of a reduced static power mode and a reduced dynamic power mode independently of one another responsive to the control signals.

2. The memory structure of claim 1, wherein the reduced static power mode is implemented by reducing a voltage difference between a voltage supply and a ground of each memory block placed in the reduced static power mode.

3. The memory structure of claim 2, wherein the reduced static power mode is a retention mode.

4. The memory structure of claim 2, wherein the reduced dynamic power mode is implemented by gating a clock signal of each memory block placed in the reduced dynamic power mode.

5. The memory structure of claim 4, wherein the control signals comprise clock enable signals, wherein the first memory block is coupled to a first clock enable signal,
    wherein the second memory block is coupled to a second clock enable signal, and
    wherein the control circuitry is configured to initiate clock gating within the first memory block and the second memory block independently of each other responsive to the first and second clock enable signals.

6. The memory structure of claim 1, wherein the first memory block is configured to implement the reduced power mode concurrently with an access to the second memory block.

7. The memory structure of claim 1,
    wherein the first memory block is configured to implement the reduced static power mode, and
    wherein the second memory block is configured to implement the reduced dynamic power mode independently of the first memory block implementing the reduced static power mode.

8. The memory structure of claim 1,
    wherein the first memory block is configured to implement the reduced static power mode according to a comparison of an inactivity window of the first memory block with an inactivity threshold for the reduced static power mode; and
    wherein the first memory block is configured to implement the reduced dynamic power mode according to a comparison of the inactivity window of the first memory block with an inactivity threshold for the reduced dynamic power mode;
    wherein the reduced static power mode and the reduced dynamic power mode are independently implemented within the first memory block and implemented independently of the second memory block.

* * * * *